United States Patent
Sato et al.

(10) Patent No.: US 6,651,179 B1
(45) Date of Patent: Nov. 18, 2003

(54) DELAY TIME JUDGING APPARATUS

(75) Inventors: Shinya Sato, Tokyo (JP); Masatoshi Sato, Tokyo (JP); Toshiyuki Okayasu, Tokyo (JP)

(73) Assignee: Advantest Corporation, Tokyo (JP)

(*) Notice: Subject to any disclaimer, the term of this patent is extended or adjusted under 35 U.S.C. 154(b) by 0 days.

(21) Appl. No.: 09/568,339

(22) Filed: May 10, 2000

(30) Foreign Application Priority Data

May 10, 1999 (JP) .......................... 11-128665
Dec. 27, 1999 (JP) .......................... 11-371468

(51) Int. Cl.$^7$ .............................. G06F 1/04
(52) U.S. Cl. ...................... 713/401; 713/503
(58) Field of Search .................. 713/400, 401, 713/500, 501, 503, 600; 327/1, 2, 3, 141, 144, 149, 152, 153, 163

(56) References Cited

U.S. PATENT DOCUMENTS

| | | | |
|---|---|---|---|
| 5,036,528 A | * 7/1991 | Costantino et al. | 375/374 |
| 5,118,975 A | 6/1992 | Hillis et al. | 307/602 |
| 5,838,179 A | * 11/1998 | Schmidt | 327/156 |
| 5,920,207 A | * 7/1999 | Suresh | 327/3 |
| 6,232,806 B1 | * 5/2001 | Woeste et al. | 327/149 |
| 6,326,812 B1 | * 12/2001 | Jefferson | 326/93 |
| 6,448,832 B1 | * 9/2002 | Takahashi | 327/270 |

FOREIGN PATENT DOCUMENTS

| | | |
|---|---|---|
| DE | 41 32 325 A 1 | 4/1993 |
| DE | 694 08 763 T 2 | 6/1998 |
| WO | WO 89/00311 | 1/1989 |

* cited by examiner

Primary Examiner—Dennis M. Butler
(74) Attorney, Agent, or Firm—Rosenthal & Osha L.L.P.

(57) ABSTRACT

Apparatus of judging delay time, capable of judging whether or not delay time for delaying an input signal is equal to a desired delay, includes: a shift clock supply unit which supplies a shift clock whose phase is delayed by the desired delayed time against a phase of a reference clock; a phase comparing unit which compares a phase of the shift clock to a phase of a delay clock for which the reference clock is delayed by a delay circuit, and then outputs a comparison signal; and a judging unit which judges whether or not the delay time of the delay circuit is equal to the desired delay time. A method therefor includes: generating a shift clock which delays a phase of a reference clock by a predetermined amount based on a desired delay time; comparing a phase of the delay clock to that of the shift clock; judging whether or not the phase of the shift clock matches that of the delay clock; and repeating a step of generating the shift clock, a step of comparing the phase and a step of judging until the phase of the delay clock matches that of the shift clock.

19 Claims, 16 Drawing Sheets

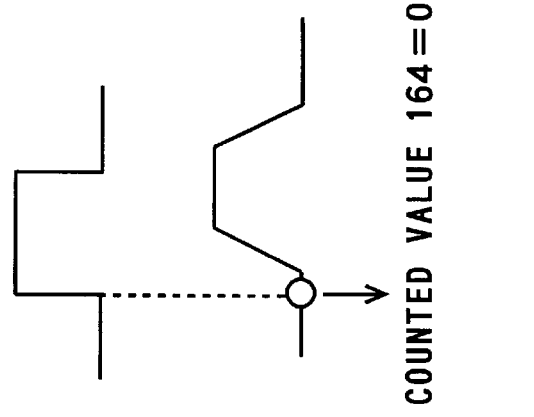
*FIG. 12B*
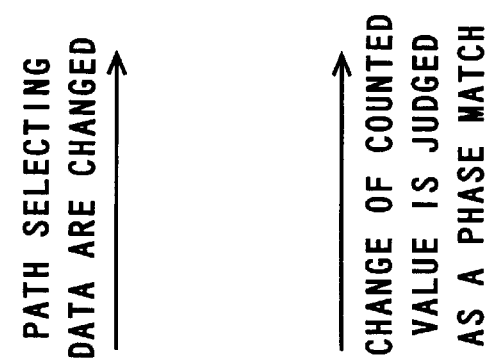
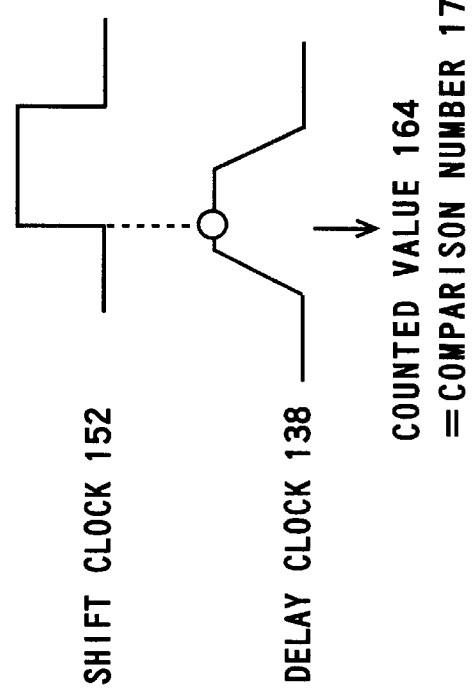
*FIG. 12A*

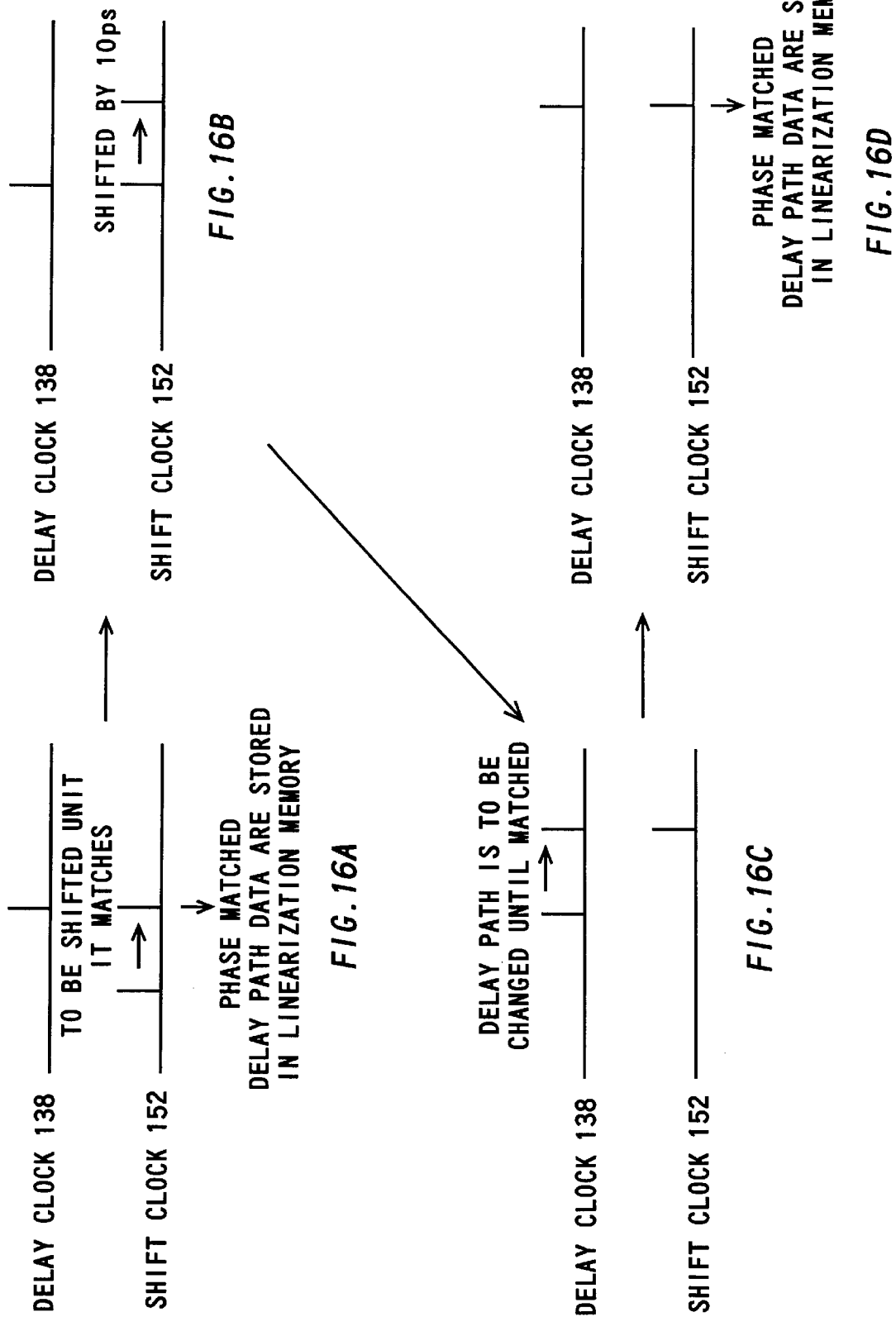

DELAY TIME JUDGING APPARATUS

This patent application claims priority based on Japanese patent applications, H11-128665 filed on May 10, 1999 and H11-371468 filed on Dec. 27, 1999, the contents of which are incorporated herein by reference.

BACKGROUND OF THE INVENTION

1. Field of the Invention

The present invention relates to a delay time judging apparatus which judges the delay time of a delay circuit, and in particular to the delay time judging apparatus which judges a delay path by which an input signal is delayed by a desired amount of time in a variable delay circuit having a plurality of the delay paths.

2. Description of the Related Art

In recent years, semiconductor devices operable at high speeds have been developed with much demand. Complying with such a trend, very severe conditions are put forth on the control of operation timing. In particular, the timing at which a test pattern is input to a semiconductor device under test need be accurately delayed against a reference clock in accordance with the input characteristics of the semiconductor device under test.

FIG. 1 is a block diagram showing a variable delay circuit 10 which delays the input signal by a desired amount of time in a semiconductor testing apparatus. The variable delay circuit 10 includes: delay elements (12a, 12b, 12c to 12n), selectors (14a, 14b, 14c to 14n) and a linearization memory 16. A clock is input from an input terminal, and the delay clock which is delayed by the desired amount of time is output from an output terminal.

The linearization memory 16 stores in a predetermined address the data which specify a delay path by which the input signal is delayed by the desired amount of time. The data on the delay paths indicate combinations of a plurality of delay elements. The selectors (14a, 14b, 14c to 14n) select either a clock having passed a delay element (12a, 12b, 12c to 12n) or a clock having not passed the delay element (12a, 12b, 12c to 12n) based on the delay path data (160a, 160b, 160c to 160n) provided from the linearization memory 16, so as to be output to a delay element to follow. For example, when a delay element prior to each selector is used for generating a predetermined delay time, "0" is set to a bit corresponding to the linearization memory 16 while otherwise (i.e., when the delay element is not used) "1" is set.

The delay elements (12a, 12b, 12c to 12n) provided in the variable delay circuit 10 are so designed that some pico seconds to some tens of pico seconds or some hundreds of pico seconds can be delayed thereby. Thus, in order to generate seven types of delay times (10, 20, 30, 40, 50, 60 and 70 pico seconds), it theoretically suffices to combine three types of delay elements having 10, 20 and 40 pico seconds.

However, there are caused errors between the designed (theoretically calculated) delay time and the actual delay time given by the delay elements, due to irregular quality of the delay elements, temperature conditions at the time of actual use of the delay elements and so on. In order to solve this problem causing the errors, an optimal delay path generating a predetermined delay time need be obtained.

FIG. 2 is a block diagram showing a conventional delay time judging apparatus 48 which measures the delay time of respective delay paths in the variable delay circuit 10. The delay time judging apparatus 48 includes: a pulse width correcting unit 24, an OR circuit 25, a frequency counter 28 and a computer 30 (test controller).

A pulse serving as a measured pulse 132 is input via the OR circuit 25, so that the pulse rounds a closed circuit comprised of the OR circuit 25, variable delay circuit 10 and pulse width correcting unit 24. During the rounding, the measured pulse 32 is delayed by the delay path selected by the variable delay circuit 10. The pulse width of the measured pulse 132 may decrease or increase due to a difference between the rise time and the fall time of semiconductor gates through which the measured pulse 132 passes during the rounding. Thus, the pulse width correcting unit 24 is provided which corrects the pulse width of the measured pulse 132. As the delay path changes, the number of rounding during a fixed period of time changes. The frequency counter 28 sends to the computer 30 the difference between a frequency at which the minimum delay path having the minimum delay amount is selected and a frequency at which other delay path than the minimum delay path is selected.

The computer 30 selects a delay path having the closest amount of delay to a predetermined delay time, based on the difference between the frequency at which the minimum delay path is selected and the frequency at which other delay path is selected. The delay path thus selected is stored in the linearization memory 16.

FIG. 3A and FIG. 3B show data stored in the linearization memory 16. The linearization memory 16 stores data on the delay path having a desired amount of delay. The data on the delay path are stored in suchawaythat the delay amount increases proportional to the increase of the address of the linearization memory 16. For example, in the addresses #0, #1, #2, ... of the linearizatin memory 16 shown in FIG. 3A, the data on the delay paths having respectively 0 ps, 10 pcs, 20 ps, ... are stored. The delay data are proportional to the delay amount as shown in FIG. 3B. Moreover, the delay time in each delay path is preferably a relative delay time against the delay time in the minimum delay path of the variable delay circuit 10, instead of an absolute delay time.

The delay time judging apparatus 48 shown in FIG. 2 measures the amounts of all delay paths that the variable delay circuit 10 has, and then transfers the thus measured delay amount to the computer 30 (tester computer). Thereafter, the data of the delay path which has the closest delay amount to the desired delay time are stored in the linearization memory 16. Since it takes time to measure the delay amount of respective delay paths, time necessary for correcting the linearization memory 16 increases, thus causing to reduce the throughput.

SUMMARY OF THE INVENTION

Therefore, it is an object of the present invention to provide a delay time judging apparatus and a method therefor which overcome the above issues in the related art. This object is achieved by combinations described in the independent claims. The dependent claims define further advantageous and exemplary combinations of the present invention.

According to one aspect of the present invention, there is provided a delay time judging apparatus which judges whether or not delay time for delaying an input signal is equal to a desired delay time, the delay time judging apparatus comprising: a shift clock supply unit which supplies a shift clock a phase of which is delayed by the desired delayed time against that of a reference clock; a phase comparing unit which compares a phase of the shift clock to a phase of a delay clock for which the reference clock is delayed by the delay circuit, so as to output a comparison signal; and a judging unit which judges whether or not the delay time of the delay circuit is equal to the desired delay time.

Preferably, the comparison signal is output in a manner that an edge timing of the delay clock is compared to that of the shift clock.

Moreover, the phase comparing unit preferably includes a flip flop having a data input to which the delay clock is input and a clock input to which the shift clock is input.

The phase comparing unit outputs the comparison signal preferably in the form of a pulse.

The judging unit preferably includes: a comparison signal counting unit which outputs a counted value obtained by counting the pulse at a predetermined time interval; and a result judging unit which determines whether or not a phase of the delay clock matches that of the shift clock based on the counted value.

The result judging unit preferably includes a first judgment unit which judges that the phase of the delay clock matches that of the shift clock on the condition that the counted value lies within a predetermined range.

When the delay circuit includes a plurality of delay paths that delay the input signal, it is preferable that the delay circuit changes the delay paths in the event that the shift clock does not match the delay clock.

Moreover, either the phase of the shift clock or the delay path may be changed in the event that the phase of the shift clock does not match that of the delay clock.

Moreover, the result judging unit may further include: a second judgment unit in which the counted value is zero at the predetermined time interval and which judges that the phase of the delay clock matches that of the shift clock in the event that at a later time of the predetermined time intervals the counted value becomes equal to the pulse number of the shift clock at the predetermined time intervals.

Furthermore, the result judging unit may further include: a third judgment unit which judges that the phase of the delay clock matches that of the shift clock in the event that the counted value equals to the number of pulse of the shift clock at the predetermined time interval and at a later time the counted value becomes 0 at the predetermined time interval.

Moreover, the delay time judging apparatus may further comprise a linearization memory which stores data specifying the delay paths.

Moreover, the delay time judging apparatus may further comprise a linearization memory control unit which instructs said linearization memory to store the desired delay time and the data specifying the delay paths in the event that the phase of the shift clock matches that of the delay clock.

Moreover, the delay time judging apparatus may further comprise a sequence control unit which instructs said comparison signal counting unit to count the comparison signal at a predetermined time duration.

The delay time judging apparatus may further comprise a phase change control unit which changes the phase of the shift clock so as to match the phase of the delay clock in the event that the delay path is set in a predetermined standard manner and the phase of the shift clock does not match that of the delay clock.

The period of the shift clock generated by the shift clock supply unit is preferably an integral multiple of the reference clock.

Moreover, the period of the shift clock is preferably greater than a delay amount of the delay circuit.

According to another aspect of the present invention there is provided a delay time judging method of judging whether or not delay time of a delay circuit for delaying an input signal is equal to a desired delay time, comprising: generating a shift clock which delays a phase of a reference clock by a predetermined amount based on the desired delay time; comparing a phase of the delay clock which is obtained by delaying the reference clock by the delay circuit, to that of the shift clock; judging whether or not the phase of the shift clock matches that of the delay clock; and repeating a step of generating the shift clock, a step of comparing the phase and a step of judging until the phase of the delay clock matches that of the shift clock.

In a case where the delay circuit includes a plurality of delay paths which delay the input signal by different delay time, the method may further comprise: changing the delay paths; and repeating a step of comparing the phase, a step of judging and a step of changing the delay paths until the phase of the delay clock matches that of the shift clock.

According to still another aspect of the present invention there is provided semiconductor device testing apparatus for testing a semiconductor device, comprising: a variable delay circuit having a plurality of delay paths; a shift clock supply unit which supplies a shift clock having the desired delayed time and phase against a reference clock; a phase comparing unit which compares a phase of the shift clock to a phase of a delay clock for which the reference clock is delayed by the delay circuit, so as to output a comparison signal; a judging unit which judges whether or not the delay time of the delay circuit is equal to the desired delay time; a timing generator including a linearization memory which stores a delay path necessary to generate the desired delay time based on the comparison signal; a pattern generator which generates a test pattern to be input to the semiconductor device; a waveform shaper which outputs a waveform-shaped-test pattern which shaped the test pattern so as to be suitable for the semiconductor device under test, based on the delay clock in which the reference clock is delayed by the delay paths stored in the linearization memory, and the test pattern; a contact portion which places the semiconductor device under test thereon and inputs the waveform-shaped test pattern to the semiconductor device under test; and a comparator which compares an output signal output from the semiconductor device which has input the waveform-shaped test pattern, to an expectation value which is expected to output from the semiconductor device under test and that is output from said pattern generator.

This summary of the invention does not necessarily describe all necessary features so that the invention may also be a sub-combination of these described features.

BRIEF DESCRIPTION OF THE DRAWINGS

FIG. 12A and FIG. 12B show timings of the delay clock 138 and the shift clock 152 when the third judging unit 82 described in conjunction with FIG. 10 judges that the phase of the delay clock 138 matches that of the shift clock 152.

FIGS. 16A, 16B, 16C and 16D show relationship between the phase of the delay clock 138 and that of the shift clock 152 shown in the flow chart of FIG. 15.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 4:
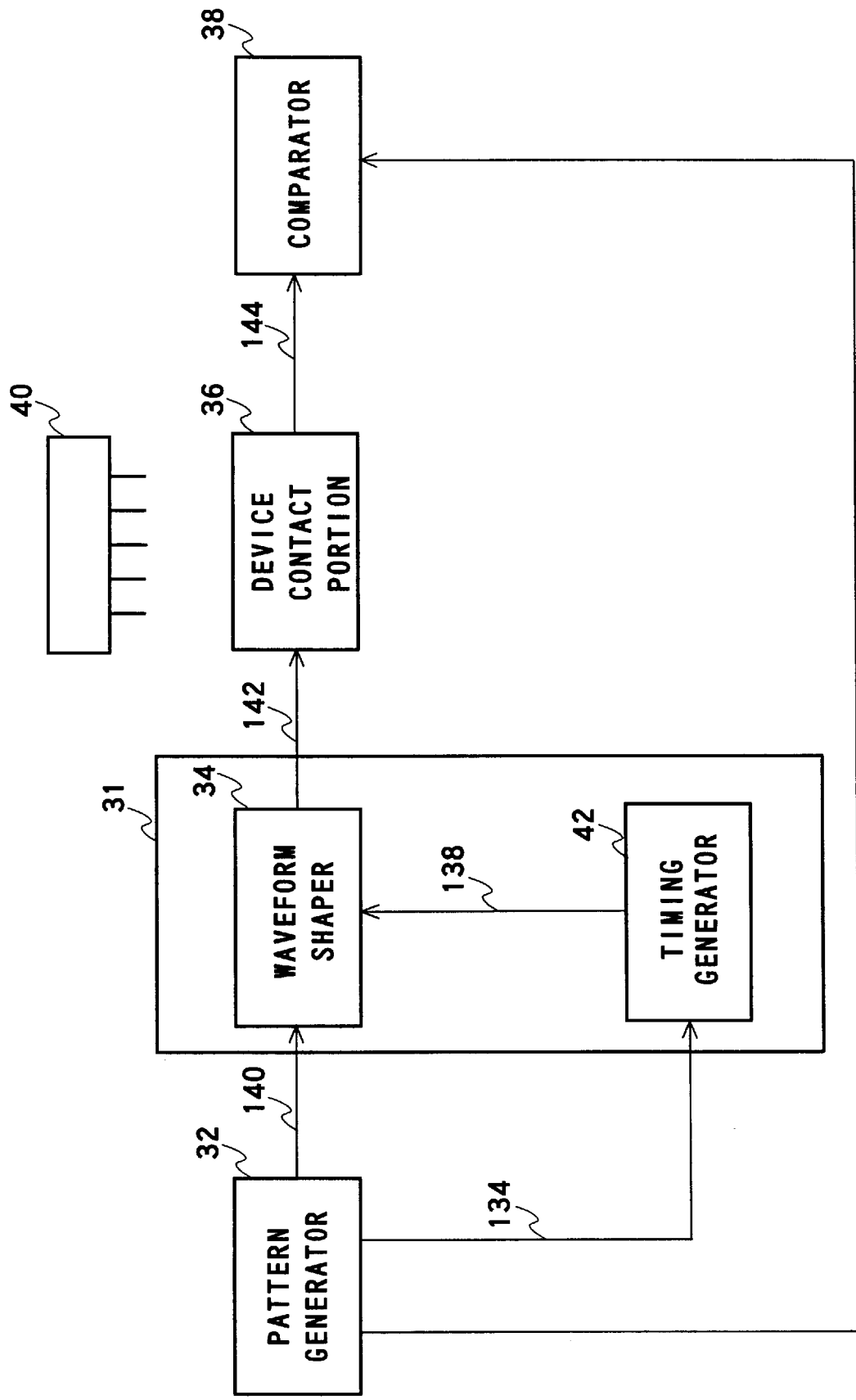
FIG. 4 is a block diagram showing an embodiment of a semiconductor apparatus.

FIG. 4 is a block diagram showing an embodiment of a semiconductor test apparatus. Referring to FIG. 4, the semiconductor test apparatus comprises a pattern generating unit 32, a delay signal generating apparatus 31, a device contact unit 36 and a comparator 38.

The device contact portion 36 comes in contact with electrodes of a device to be tested 40, and inputs and outputs a signal to and from the device to be tested 40. For instance, the device contact portion 36 may be a connector or the like which is electrically connected to the device to be tested 40 by inserting the device to be tested 40. While the device to be tested 40 is being tested, the device to be tested 40 is mounted in such a manner that the device to be tested 40 electrically comes in contact with the device contact portion 36. The pattern generating unit 32 generates pattern data 140 which serve as a test pattern entering the device to be tested 40, and expected value data 146 which is to be output from the device to be tested 40 which has input the pattern data 140. The pattern generating unit 32 outputs the pattern data 140 to a waveform shaper 34, and also outputs the expected value data 146 to the comparator 38. Moreover, the pattern generating unit 34 outputs a timing-setting signal 134, which sets to generate a delay clock 138 corresponding to the performance characteristic of the device to be tested 40, to a timing generator 42.

The timing generator 42 outputs the delay clock 138 based on the timing-setting signal 134, to the waveform shaper 34. Namely, the timing generator 42 generates the delay clock 138 based on a delay time set by the timing-setting signal 134 so as to be supplied to the waveform shaper 34.

The waveform shaper 34 shapes the pattern data 140 based on the delay clock 138 supplied from the timing generator 42, and outputs a shaped pattern data 142 corresponding to the performance characteristic of the device to be tested 40, to the device contact portion 36. The device contact portion 36 outputs the shaped pattern data 142 to the device to be tested 40. An output signal 144 fed from the device to be tested 40 to which the shaped pattern data 142 are input, is input to the comparator 38 via the device contact portion 36. The device to be tested 40 is tested in a manner that the output signal 144 is compared with the expected value data 146 by the comparator 38, so that it is judged that the tested device is of accepted quality or not.

Figure 5:
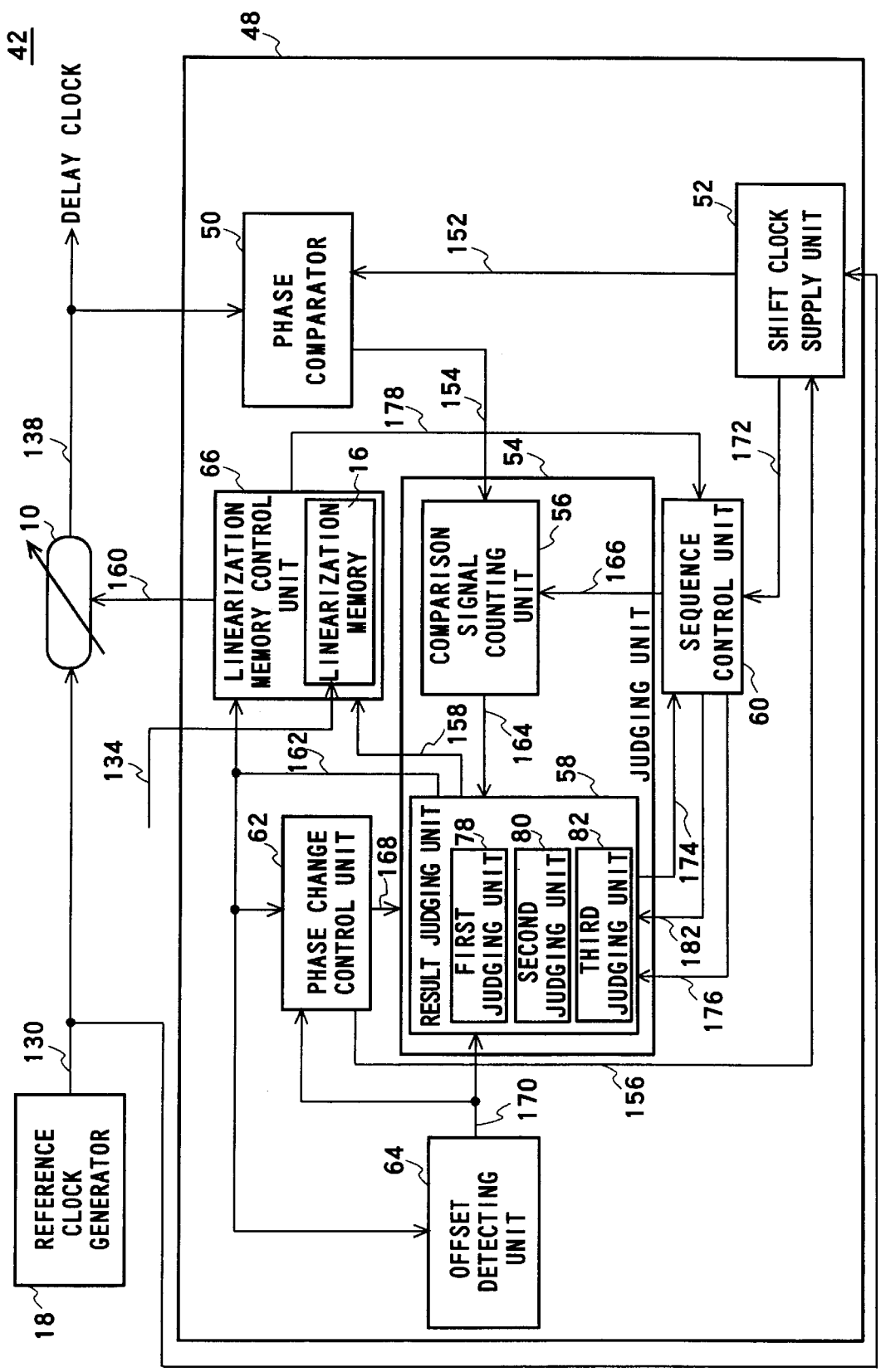
FIG. 5 is a block diagram showing a detailed structure of the timing generator 42.

FIG. 5 is a block diagram showing a detailed structure of the timing generator 42. The timing generator 42 includes a reference clock generator 18, a variable delay circuit 10 and a delay time judging apparatus 48. The delay time judging apparatus 48 includes a phase comparing unit 50, a shift clock supplying unit 52, a judging unit 54, a phase change controlling unit 62, a linearization memory control unit 66, a sequence control unit 60 and an offset detecting unit 64. The judging unit 54 includes a comparison signal counter 56 and a result judging unit 58. The linearization memory control unit 66 includes a linearization memory 16.

The reference clock generator 18 generates a reference clock 130 and supplies the reference clock 130 to the variable delay circuit 10 and the shift clock supplying unit 52 provided in the delay time judging apparatus 48. The variable delay circuit 10 delays the reference clock 130 so as to output the delay clock 138.

The phase change controlling unit 62 generates a phase change signal 156 which specifies a phase shifting amount (amount by which the phase is moved). The shift clock supplying unit 52 generates a shift clock 152 whose phase is delayed by a predetermined amount relative to the phase of the reference clock 130. The shift clock supplying unit 52 shifts the phase by a constant amount every time a single pulse of the phase change signal 156 is input thereto. For example, consider a case where when the shift clock 152 is shifted for a single time, the phase of the shift clock 152 is displaced by 2 ps. Then, in order to obtain the shift clock 152 whose phase is delayed by 10 ps, the phase of the shift clock 152 need be shifted for five times.

The shift clock supplying unit 52 requires a certain fixed period of time in generating the shift clock 152 having a phase shifting amount specified by the phase change signal 156. Thus, when a certain fixed period of time elapsed after the timing at which the phase change signal 156 is supplied, the shift clock supplying unit 52 supplies a phase lock signal 172 indicating that the shift clock 152 having a predetermined shifted amount, to the sequence control unit 60.

The phase comparator 50 compares a phase of the shift clock 152 with that of the delay clock 138, so as to output a comparison signal 154. In this embodiment, the phase comparator 50 compares the timing between an edge of the delay clock and an edge of the shift clock 152 so as to output the comparison signal 154.

The comparison signal counter 56 in the judging unit 54 outputs a count value 164 obtained by counting the number of pulse for the comparison signal 154, during the period in which a count enable signal 166 is being supplied from the sequence control unit 60. For example, the comparison signal counter 56 maybe a counter which counts the number of pulse of the comparison signal 154 during the period in which the count enable signal 166 is being supplied.

A result judging unit 58 in the judging unit 54 includes the first judging unit 78, second judging unit 80 and third judging unit 82. The respective first judging unit 78, second judging unit 80 and third judging unit 82 judge whether or not the phase of the shift clock 152 is matched with that of the delay clock 138, upon receipt of a judge start signal 182 from the sequence control unit 60. The result judging unit 58 supplies a judging result signal 162 indicating whether or not the phase of the delay clock 138 is matched with that of the shift clock 152, to the phase change controlling unit 62, offset detecting unit 64 and linearization memory control unit 66. When the judgement on whether or not the phase of the delay clock 138 is matched with that of the shift clock 152 is terminated, the result judging unit 58 sends a judge end signal 174 indicating that the result judging unit 58 is ready for the next judgment, to the sequence control unit 60.

Figure 1:
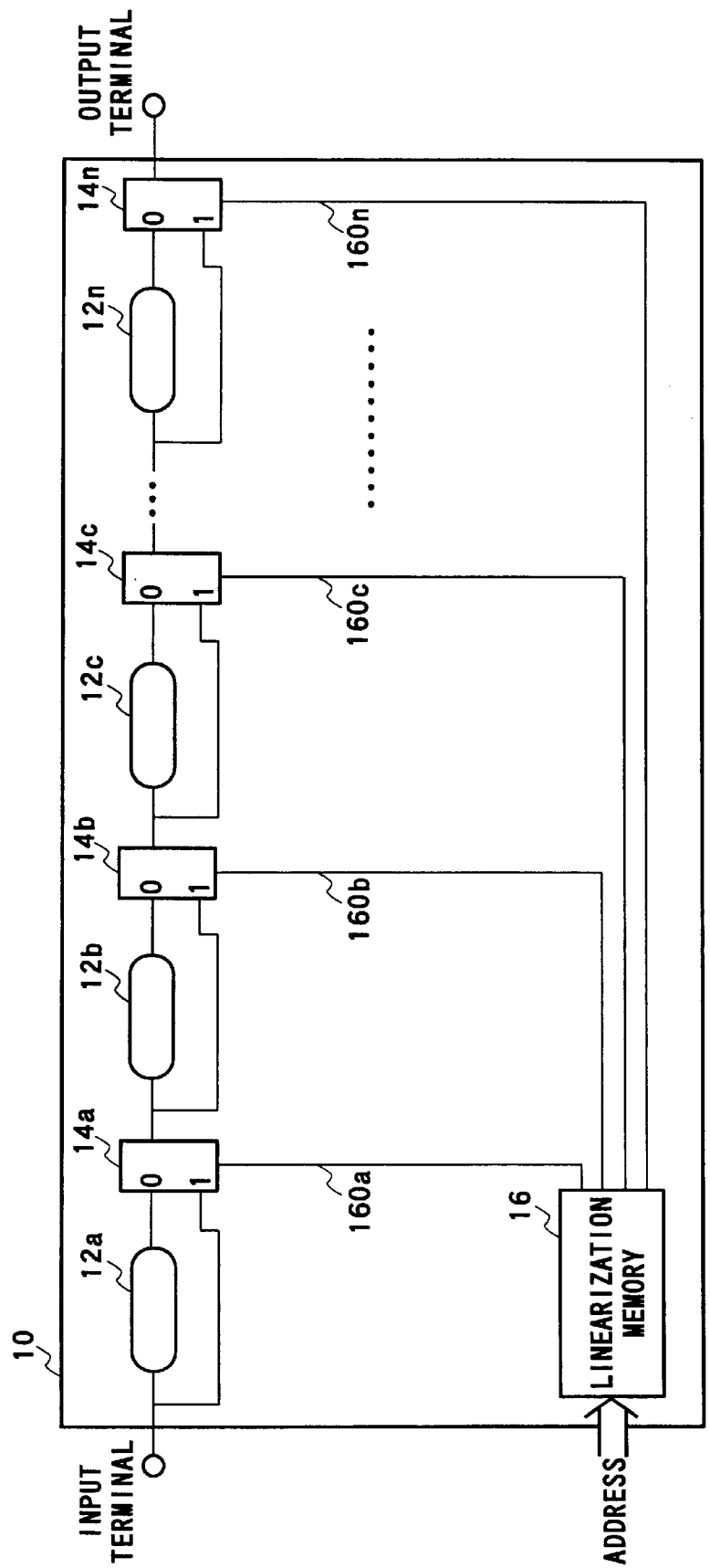
FIG. 1 is a block diagram showing a variable delay circuit 10 which delays the input signal by a desired amount of time in a semiconductor testing apparatus.
Figure 2:
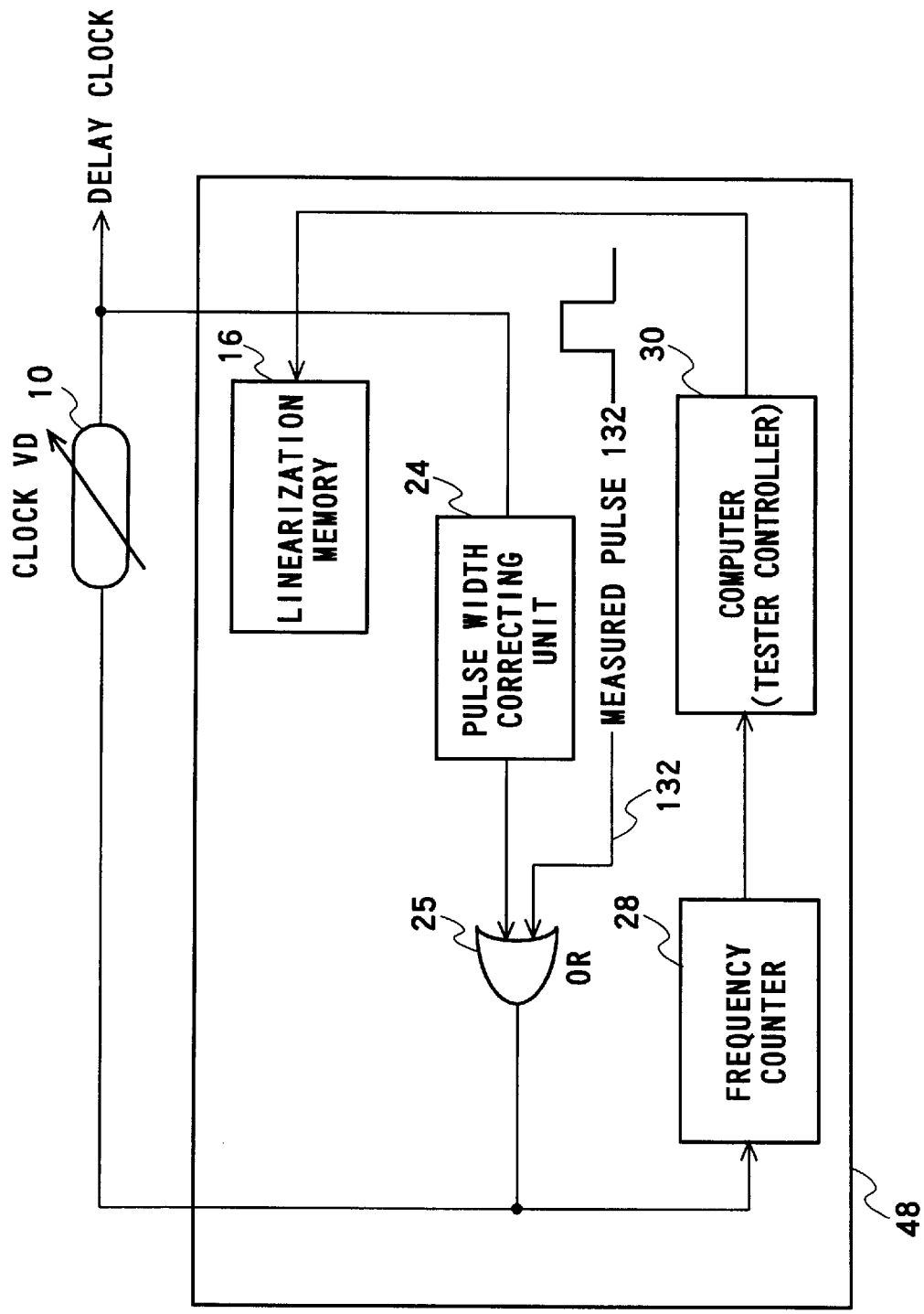
FIG. 2 is a block diagram showing a conventional delay time judging apparatus 48 which measures the delay time of respective delay paths in the variable delay circuit 10.
Figure 3:
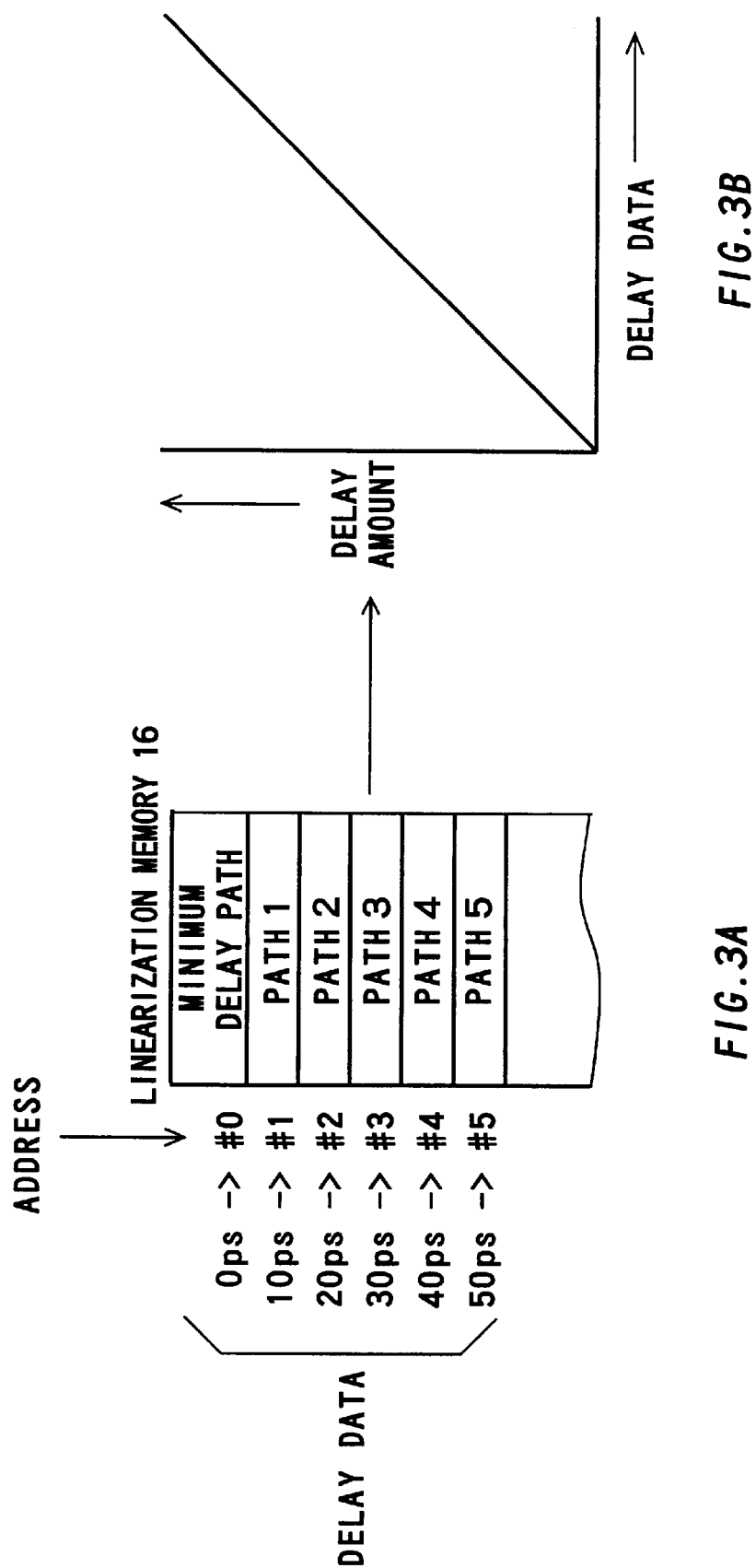
FIG. 3A and FIG. 3B show data stored in the linearization memory 16.

The offset detecting unit 64 outputs an offset detecting signal indicating whether or not the phase of the delay clock 138 is generated by a predetermined reference path in the variable delay circuit 10, to the result judging unit 58 and phase change controlling unit 62. In this embodiment, the reference path is set to the minimum delay path which delays the input signal with the minimum delay time. In the variable delay circuit 10 shown in FIG. 1, this is equivalent to the path obtained by which all of selectors 14a, 14b, 14c . . . 14n select the input "1".

When the offset signal indicates that the phase of the delay clock 138 generated by the minimum delay path is detected thereby, the result judging unit 58 outputs a path change signal 158 which requests the linearization memory control unit 66 to change the delay path, based on the judging result signal 162.

The phase change controlling unit 62 outputs a phase change signal 156 which requests the phase of the shift clock 152 to change according to the judging result signal 162 supplied from the result judging unit 58 and an offset detecting signal 170 supplied from the offset detecting unit 64, to the shift clock supplying unit 52. The phase change controlling unit 62 outputs a judgment enable signal 168 specifying that a determining process on whether or not the phase of the delay clock 138 is matched with that of the shift clock 152 may be started, to the result judging unit 58.

The linearization memory control unit 66 stores a delay path specifying the delay path having a desired delay amount in the linearization memory 16, based on the judging result signal 162 indicating that the phase of the delay clock 138 is identical to that of the shift clock 152. Moreover, based on a path change signal 158 requesting the change of the delay path supplied from the result judging unit 58 the linearization memory control unit 66 outputs delay path data 160 to the variable delay circuit 10. Moreover, the linearization memory control unit 66 outputs an automatic linearization terminating signal 178 (which simply appears as auto linearization end signal in figures) to the sequence control unit 60 as soon as the delay path data are stored in the whole address space of the linearization memory 16.

The sequence control unit 60 supplies the count enable signal 166 which specifies to the comparison signal counter 56 that the comparison signal 154 supplied from the phase comparison unit 50 shall be counted, to the comparison signal counter 56 based on the judge end signal 174, phase lock signal 172 and automatic linearization terminating signal 178. For example, after confirming that the delay path has not been determined, the phase of the shift clock 152 is stable and that the result judging unit 58 is in the state capable of judging the next one, the sequence control unit 60 may supply the count enable signal 166 to the comparison signal counter 56.

The sequence control unit 60 may include a counter, not shown, which counts the number of pulse of the shift clock 152. The sequence control unit 60 outputs the comparison count value 176 which is obtained by measuring the number of pulse of the shift clock 152 during the supply period of the count enable signal 166 after the supply of the count enable signal 166 is stopped. The sequence control unit 60 outputs a judge start signal 182 requesting the start of judgement on match/no-match of the phase, to the result judging unit 58.

By implementing the delay time judging apparatus 48 according to the present embodiment, the combination of delay elements (12a–12n) of the variable circuit having a desired delay amount can be stored respectively in the linearization memory 16. The timing generator 42 selects the delay path having the delay amount specified by the timing set signal 134, based on the delay path data stored in the linearization memory 16, and supplies the delay clock 138 specified by the timing set signal 134 to the waveform shaper 34.

The shift clock supplying unit 52 need generate a shift clock 152 having a predetermined shift amount. However, the shift clock 152 having a different shift amount from the predetermined shift amount might be produced due to manufacturing irregularity against an ideal shift amount.

Figure 6:
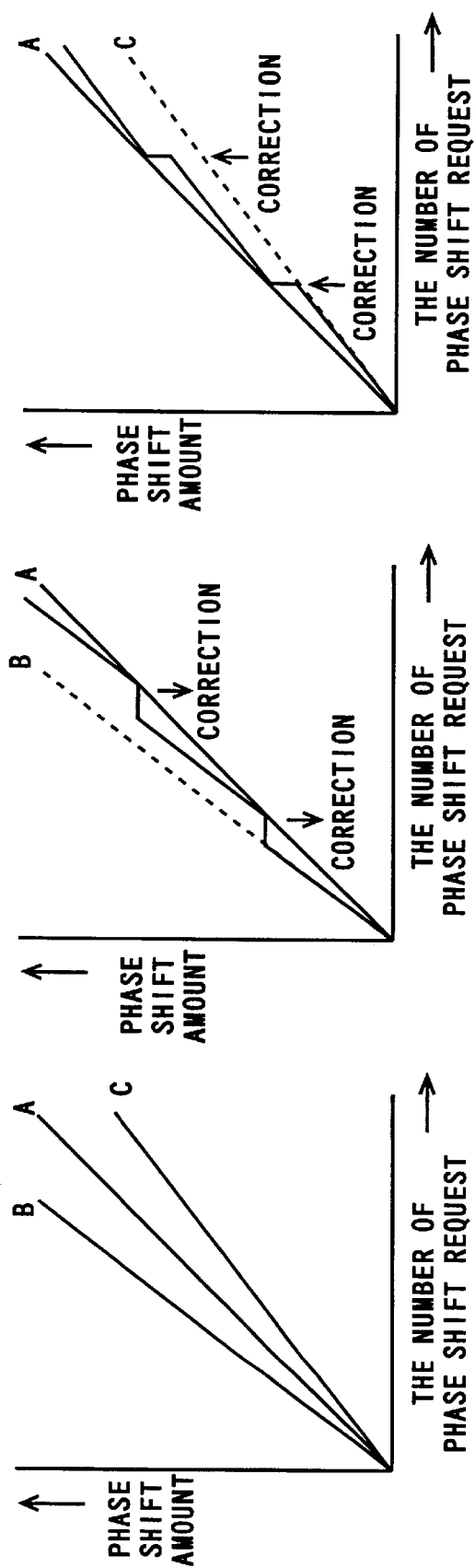
FIG. 6A shows relation between the number of request for the phase shift specified by the phase change signal 156, that is the number of pulse of the phase change signal 156, and the phase shift amount generated at the shift clock 152.
FIG. 6B shows to adjust the straight line B.
FIG. 6C shows to adjust the straight line C.

FIG. 6A shows relation between the number of request for the phase shift specified by the phase change signal 156, that is the number of pulse of the phase change signal 156, and the phase shift amount generated at the shift clock 152. The straight line denoted A indicates the relation between the ideal number of the phase shift request and the shift amount, which means a desirable case where if the number of the phase shift request is 1 then the shift amount will also be 1. In the straight line denoted B, the phase shift amount is greater compared to the line A while in the straight line denoted C the phase shift amount is less compared to the line A. When the relation between the number of phase shift request and the phase shift amount is as shown by the line A or line B, the line A or line B need be adjusted so that it will become close to the line A.

FIG. 6B shows how to adjust the straight line B. Referring to FIG. 6B, in order to adjust the straight line B, the delay time judging apparatus 48 adjusts the straight line B by reducing the phase shift amount using the number of predetermined phase shift request. FIG. 6C shows how to adjust the straight line C. Referring to FIG. 6C, in order to adjust the straight line C, the delay time judging apparatus 48 adjusts the straight line C by increasing the phase shift amount using the number of predetermined phase shift request.

Figure 7:
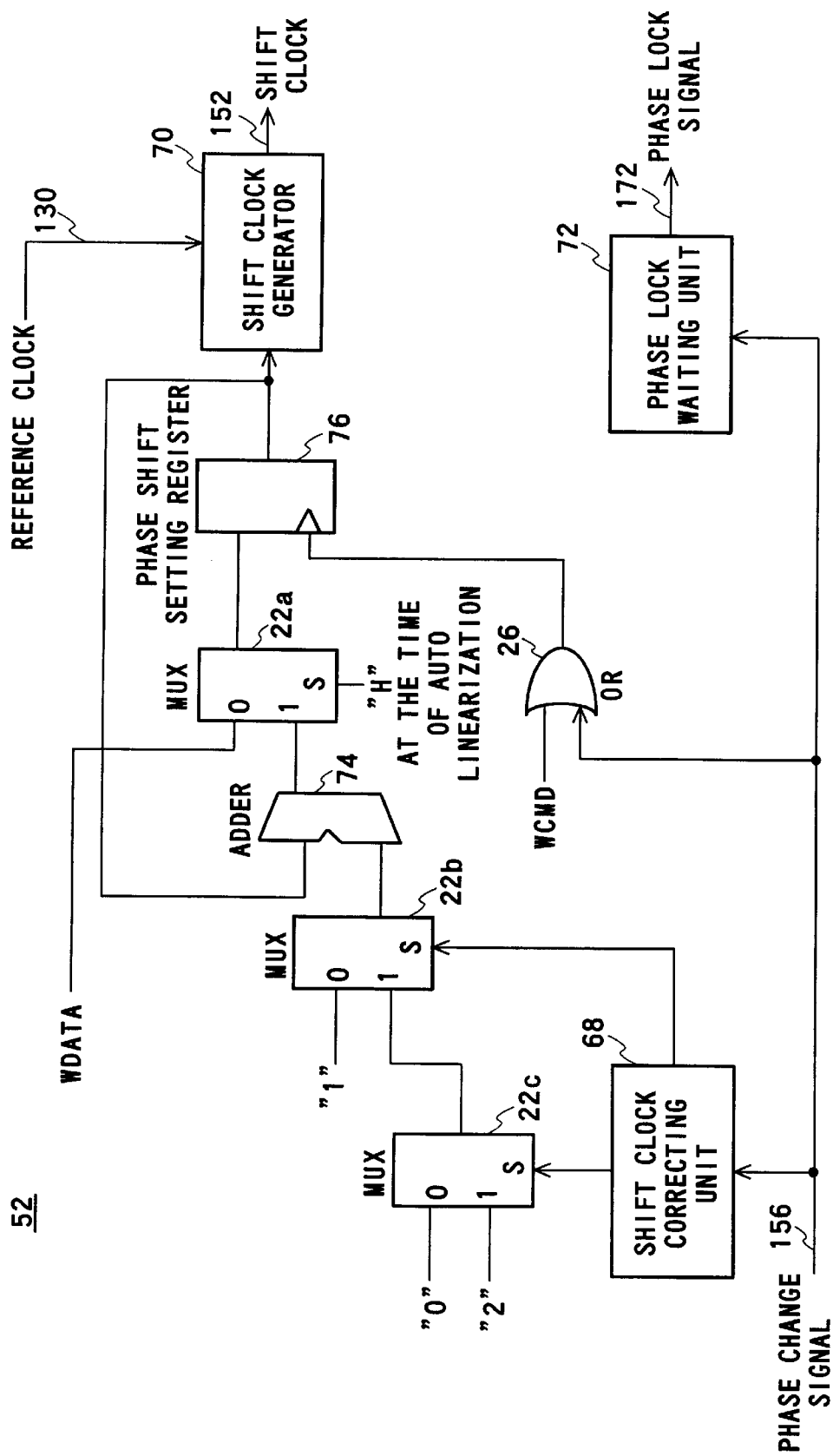
FIG. 7 is a block diagram showing the shift clock supplying unit 52 according to an embodiment of the present invention.

FIG. 7 is a block diagram showing the shift clock supplying unit 52 according to a present embodiment. The shift clock supplying unit 52 comprises a selector 22a, a selector 22b, a selector 22c, an OR circuit 26, a shift clock correcting unit 68, a shift clock generator 70, a phase lock waiting unit, an adder 74 and a phase shift setting register 76.

In this specification the terms "adjust" and "correct" are used interchangeably.

The shift clock correcting unit 68 is provided in order to correct the error caused between a shifted amount which is specified by the phase change signal 156 and that in the actual shift clock 152. In order to perform the correction shown in FIG. 6B, the shift clock correcting unit 68 selects an input 0 of a selector 22c and a correction value "0" is output to the adder 74 via an input 1 of the selector 22b. In order to perform the correction shown in FIG. 6C, the shift clock correcting unit 68 selects an input 1 of the selector 22c, so that a correction value "2" is output to the adder 74 via the input 1 of the selector 22b. In the case where no correction is necessary, the shift clock correcting unit 68 selects an input 0 of the selector 22b, so that a phase shift amount "1" is output to the adder 74.

The adder 74 sums an output value from the selector 22b and a setting value output from the phase shift setting register 76, so that the thus summed-up value is output to an input 1 of the selector 22a. Therefore, according to the present embodiment, in the case where there is no correction necessary, a phase of the shift clock 152 is incremented by one shift.

The selector 22a is provided so that two settings can be selected where one setting is such that the shifted amount of a phase of the phase shift clock 152 is automatically set while other setting is such that it is manually set using a tester controller (not shown) which controls a whole semiconductor testing apparatus. In the case where the shifted amount of the phase of the shift clock 152 is automatically set, the input 1 of the selector 22a is selected. Thus, the phase shift setting register 76 stores an output value of the adder 74. The phase shift setting register 76 outputs the stored setting value to the shift clock generator 70 at a timing of the phase change signal 156 supplied through the OR circuit 26. The shift clock generator 70 generates a shift clock whose phase is shifted, based on the setting value supplied from the phase shift setting register 76. The period of the shift clock 152 is preferably of an integral multiple of that of the reference clock 130 and is greater than the delay amount of the variable delay circuit 10.

In the case where the shifted amount of the phase of the shift clock 152 is set manually using the test controller (not shown), the input 0 of the selector 22a is selected. A setting value WDATA is supplied from the test controller (not shown), and is stored in the phase shift setting register 76 via the input 0 of the selector 22a. The setting value stored in the phase shift setting register 76 is output to the shift clock generator 70 at a timing of a WCMD signal input via the OR circuit 26.

When a predetermined period of time elapses after the timing at which the phase change signal 156 is supplied, the phase lock waiting unit 72 outputs to the sequence control unit 60 a phase lock signal 172 indicating that the shift clock 152 having a shifted amount specified by the setting value supplied from the phase shift setting register 76.

Figure 8:
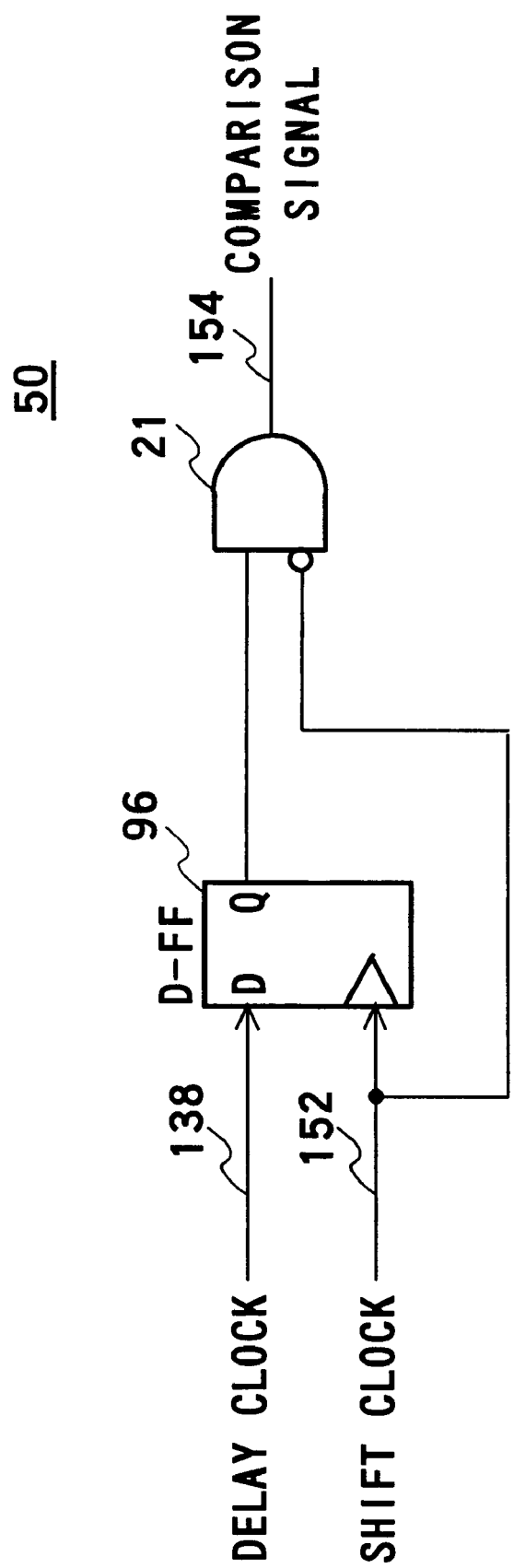
FIG. 8 is a block diagram showing an embodiment of the phase comparator 50.

FIG. 8 is a block diagram showing an embodiment of the phase comparator 50. The phase comparator 50 comprises a flip flop 96 and an AND circuit 21. The flip flop 96 takes a voltage value given at a D terminal (data input portion) of the flip flop 96 by the delay clock 138 output from the variable delay circuit 10, at the timing of the rising edge of a pulse of the shift clock 152 output from the shift clock supplying unit 52, and outputs its logical value from a Q terminal of the flip flop 96. The flip flop 96 may input the shift clock 152 to the data input portion of the flip flop, and may input the delay clock 138 to a clock input portion of the flip flop 96. The AND circuit 21 outputs a logical multiplication of an output value output from the flip flop 96 and a logical value which reversed the shift clock 152, at the same period as the shift clock 152.

FIGS. 9A, 9B and 9C are timing charts showing the timings of shift clock 152, delay clock 138 and comparison signal 154 in the phase comparator 50 described with reference to FIG. 8. FIG. 9A and FIG. 9B show that a phase of the delay clock 138 does not match that of the shift clock 152. FIG. 9C shows that a phase of the delay clock 138 matches that of the shift clock 152. In these timing charts, the period of the shift clock 152 is twice that of the reference clock 130. In the case of FIG. 9A, the counted value 164 equals the number of pulse in the shift clock 152 in the period of during which a count enable signal 166 is supplied. In the case of FIG. 9B, the counted value 164 becomes 0.

On the other hand, in the case of FIG. 9C, the flip flop 96 outputs a logical value based on a voltage value of the delay clock 138 in a pulse rising period of the delay clock 138. Thus, the comparison signal 154 will be indeterminate, that is, the logical value of either "1" or "0" will not be firmly determined. Thus, being constantly "1" or "0" will not occur. The ratio at which the logical value "1" or "0" occupies against the logical values output from the flip flop 96 is determined by a threshold of the flip flop 96. Thus, when the counted value 164 obtained by counting the comparison signals 154 is within a predetermined range, a result judging unit 58 judges that a phase of the delay clock 138 matches that of the shift clock 152. For instance, if the comparison count value 176 is 100, the predetermined range may be set as 1–99.

Figure 10:
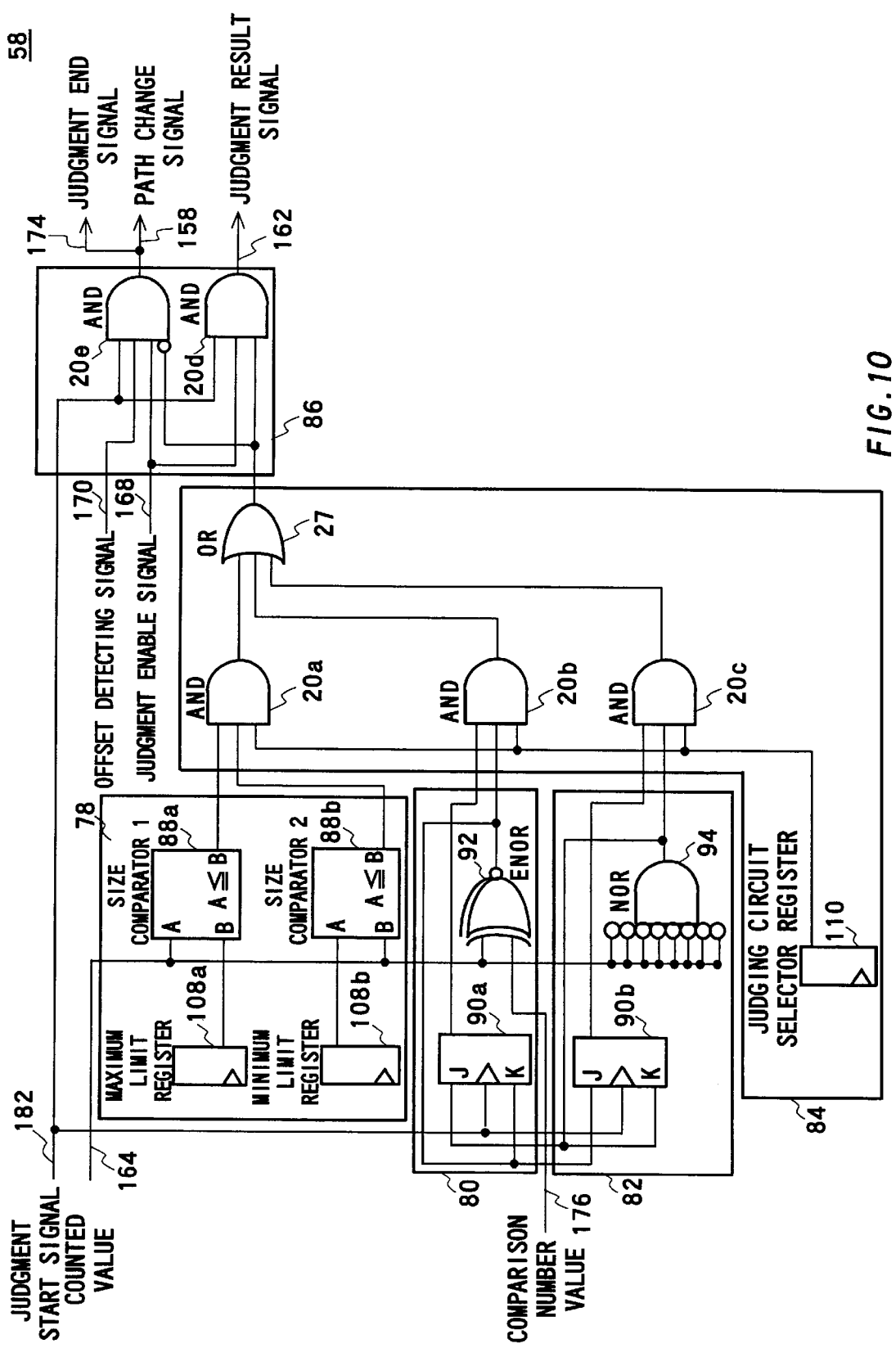
FIG. 10 is a block diagram showing an embodiment of the result judging unit 58.

FIG. 10 is a block diagram showing an embodiment of the result judging unit 58. The configurations shown in FIG. 10 bearing the same reference numerals as in FIG. 5 achieve the same or similar function and operation corresponding to those of FIG. 5. The result judging unit 58 comprises: a first judging unit 78; a second judging unit 80; a third judging unit 82; a phase match judging unit 84; and a judgment result signal output unit 86. The first judging unit 78 includes: size comparators 88a and 88b; a maximum limit register 108a; and a minimum limit register 108b. The second judging unit 80 includes a J-K flip flop 90a and an ENOR circuit 92. The third judging unit 82 includes a J-k flip flop 90b and a NOR circuit 94. The phase match judging unit 84 includes: AND circuits 20a, 20b and 20c; an OR circuit 27; and a judging circuit selector register 110. The judgment result signal output unit 86 includes AND circuits 20d and 20e.

Figure 9:
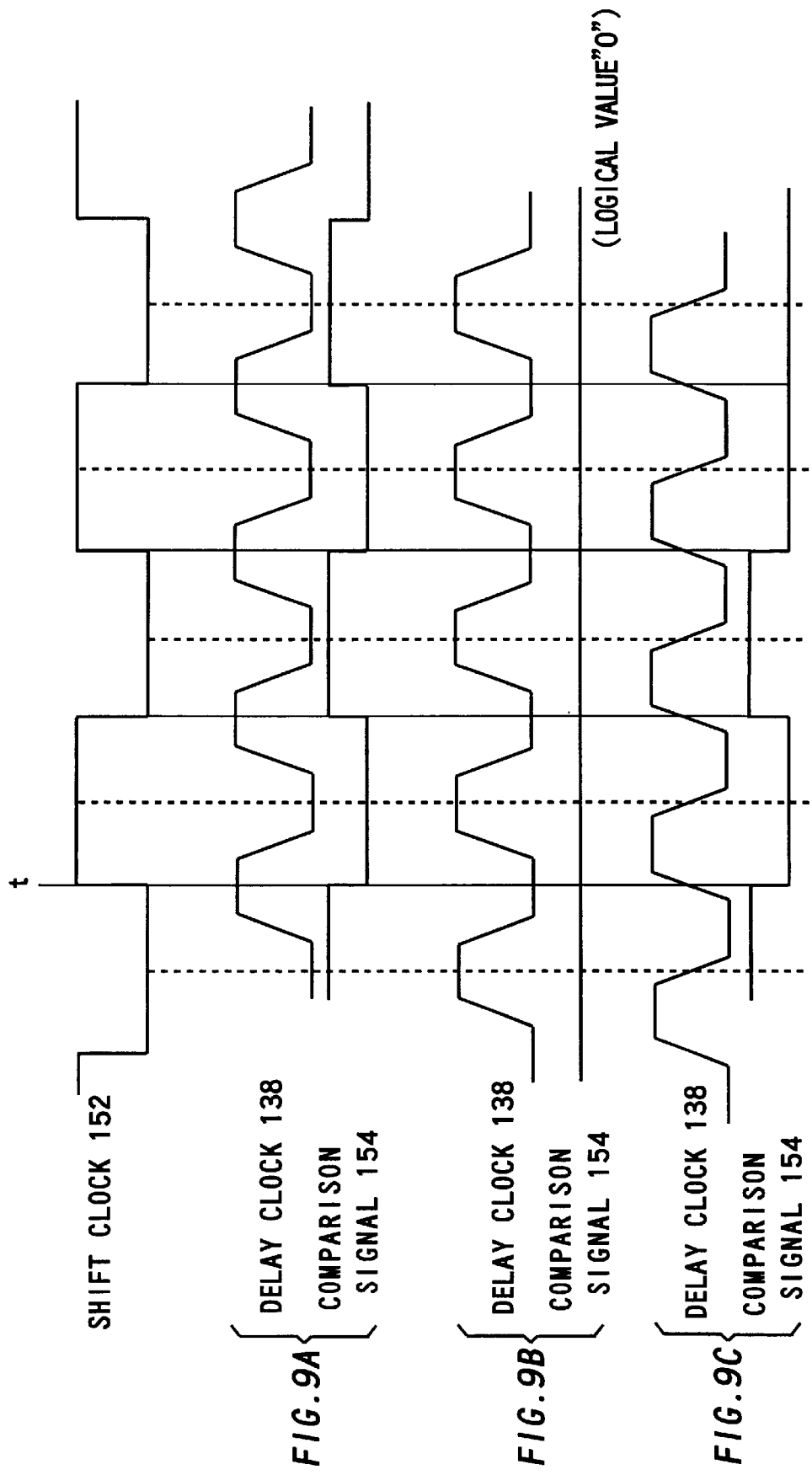
FIGS. 9A, 9B and 9C are timing charts showing the timings of shift clock 152, delay clock 138 and comparison signal 154 in the phase comparator 50 described with reference to FIG. 8.

When the counted valued 164 supplied from the comparison signal counting unit 56 is within the predetermined range described in connection with FIG. 9, the first judging unit 78 judges that a phase of the delay clock 138 matches that of the shift clock 152. The maximum limit register 108a stores an upper limit value indicating an upper limit of the predetermined range. The size comparator 88a compares the counted value 164 supplied from the comparison signal counting unit 56 to the upper limit value stored in the maximum limit register 108a, so that the logical value "1" is output when the counted value 164 is less than the upper limit value stored in the maximum limit register 108a.

The minimum limit register 108b stores a lower limit value of the predetermined range. The size comparator 88b compares the counted value 164 supplied from the comparison signal counting unit 56 to the lower limit value stored in the minimum limit register 108b, so that the logical value "1" is output when the counted value 164 is greater than the lower limit value stored in the minimum limit register 108b. For example, when the predetermined range is set to greater than 1 and less than 99, 99 is stored in the maximum limit register 108a while 1 is stored in the minimum limit register 108b.

The AND circuit 20a outputs a logical multiplication of the output values from the size comparators 88a and 88b, and the output value from the judging circuit selector register 110, to the judgment result signal output unit 86 via the OR circuit 27. Suppose that the output values of both the size comparators 88a and 88b are "1" and the output value from the judging circuit selector register 110 is "1", then it is judged that the phase of the delay clock 138 matches that of the shift clock 152.

The AND circuit 20d outputs to a linearization memory control unit 66, the phase change control unit 62 and the offset detecting unit 64 the judgment result signal 162 which is the logical multiplication of (1), (2) and (3) where:

(1) an output value of the OR circuit 27;
(2) a judgment enable signal 168 supplied from the phase change control unit 62; and
(3) a judgment start signal 182 supplied from the sequence control unit 60.

The AND circuit 20e outputs respectively to the sequence control unit 60 and the linearization memory control unit 66 a judgment end signal 174 and the path change signal 158 which are the logical multiplication of (4), (5), (6) and (7) where:

(4) an inverted value of the output value of the OR circuit 27;
(5) an offset detecting signal 170 supplied from the offset detecting unit 64;
(6) the judgment enable signal 168 supplied from the phase change control unit 62; and
(7) the judgment start signal 182 supplied from the sequence control unit 60.

The second judging unit 80 judges that the phase of the delay clock 138 matches that of shift clock 152 when the counted value of the pulse number of the comparison signal 154 is 0 (i.e. the counted value 164 is 0) in the predetermined period during which the count enable signal 166 is being supplied, and the counted value of the pulse number of the comparison signal 154 in the latter period becomes the comparison count value 176 which equals the pulse number of the shift clock 152 supplied to the phase comparison unit 50 in the period during which the count enable signal 166 is being supplied to the comparison signal counting unit 56.

Moreover, the third judging unit 82 judges that the phase of the delay clock 138 matches that of shift clock 152 when the counted value of the pulse number of the comparison signal 154 is the comparison count value 176 in the predetermined period during which the count enable signal 166 is being supplied, and the counted value of the pulse number of the comparison signal 154 in the latter period becomes 0.

When the counted value 164 matches the comparison count value 176, the ENOR circuit 92 outputs the logical value "1" to the AND circuit 20b, a K input of the J-K flip flop 90a and a J input of the J-K flip flop 90b. Then, the J-K flip flop 90b outputs the logical value "1" to the AND circuit 20c at the timing of the judgment start signal 182.

When the counted value 164 is 0, the NOR circuit 94 outputs the logical value "1" to the AND circuit 20c, a J input of the J-K flip flop 90a and a K input of the J-K flip flop 90b. Then, the J-K flip flop 90b outputs the logical value "1" to the AND circuit 20b at the timing of the judgment start signal 182.

When the output value of the J-K flip flop 90a is the logical value "1" and the output value of the ENOR circuit 92 becomes the logical value "1", the second judging unit 80 judges that the phase of the delay clock 138 matches that of the shift clock 152.

When the output value of the J-K flip flop 90b is the logical value "1" and the output value of the NOR circuit 94 becomes the logical value "1", the third judging unit 82 judges that the phase of the delay clock 138 matches that of the shift clock 152.

The judging circuit selector register 110 outputs a signal which specifies that any of the judgments of the first judging unit 78, the second judging unit 80 and the third judging unit 82 is (are) in effect, to the AND circuits 20a, 20b and 20c. It is preferable that the first judging unit 78 and the second judging unit 80 are effective when the offset detecting signal 170 is the logical value "0" while the first judging unit 78 and the third judging unit 82 are effective when the offset detecting signal 170 is the logical value "1".

Figure 11B:
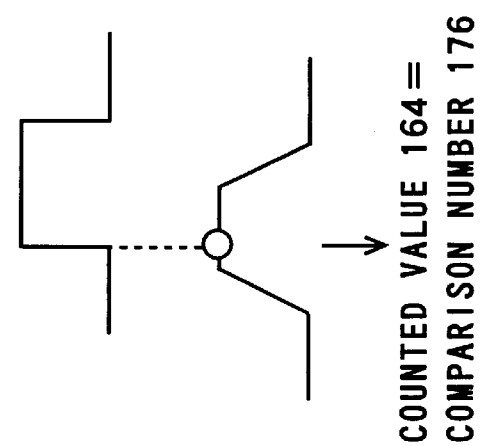
FIG. 11A and FIG. 11B show timings of the delay clock 138 and the shift clock 152 when the second judging unit 80 described in connection to FIG. 10 judges that the phase of the delay clock 138 matches that of the shift clock 152.
Figure 11A:
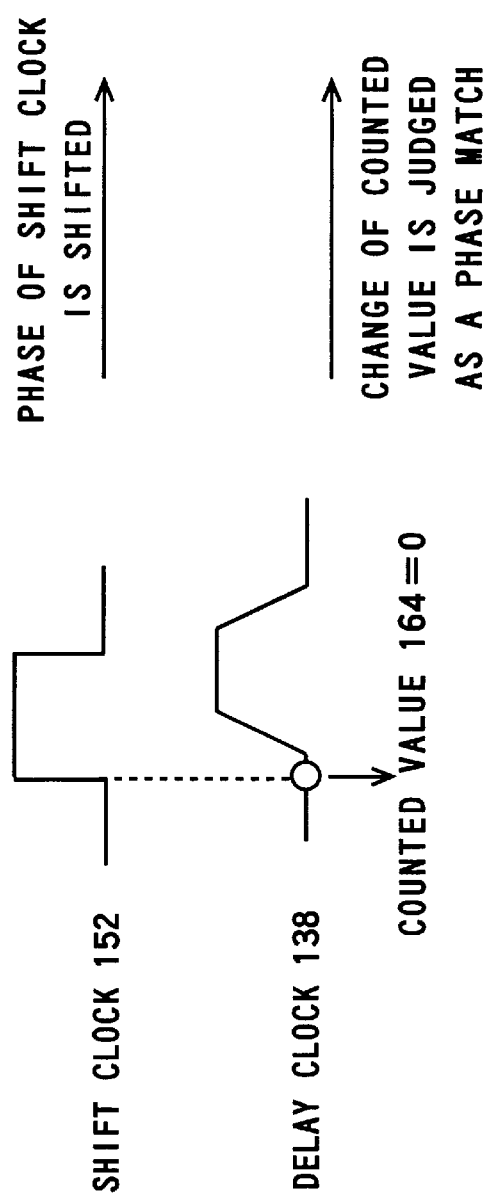

FIG. 11A and FIG. 11B show timings of the delay clock 138 and the shift clock 152 when the second judging unit 80 described in connection to FIG. 10 judges that the phase of the delay clock 138 matches that of the shift clock 152.

FIG. 11A shows timings of the shift clock 152 and the delay clock 138 in a certain period. When the phase of the shift clock 152 and that of the delay clock 138 are those at the timing shown in FIG. 11A, the counted value 164 is 0. Thus, it is judged that the phase of the delay clock 138 does not match that of the shift clock 152.

Based on the above judgment of no phase match, the phase of the shift clock 152 is changed. When the shifted amount of the shift clock 152 is rather large per change, there is obtained a timing as shown in FIG. 11B, thus the counted value 164 equals the comparison count value 176. When the counted value 164 changes from 0 to the comparison count value 176, the second judging unit 80 judges that the phase of the delay clock 138 matches that of the shift clock 152.

FIG. 12A and FIG. 12B show timings of the delay clock 138 and the shift clock 152 when the third judging unit 82 described in conjunction with FIG. 10 judges that the phase of the delay clock 138 matches that of the shift clock 152.

FIG. 12A shows timings of the shift clock 152 and delay clock 138 in a certain period. When the phase of the shift clock 152 and that of the delay clock 138 are those at the timing shown in FIG. 12A, the counted value 164 becomes equal to the comparison count value 176. Thus, it is judged that the phase of the delay clock 138 does not match that of the shift clock 152.

Based on the above judgment of no phase match, the delay path is changed. When the shifted amount of the delay path changes in a large scale, there is obtained a timing as shown in FIG. 12B, thus the counted value 164 becomes equal 0. When the counted value 164 changes from the comparison count value 176 to 0, the third judging unit 82 judges that the phase of the delay clock 138 matches that of the shift clock 152.

Figure 13:
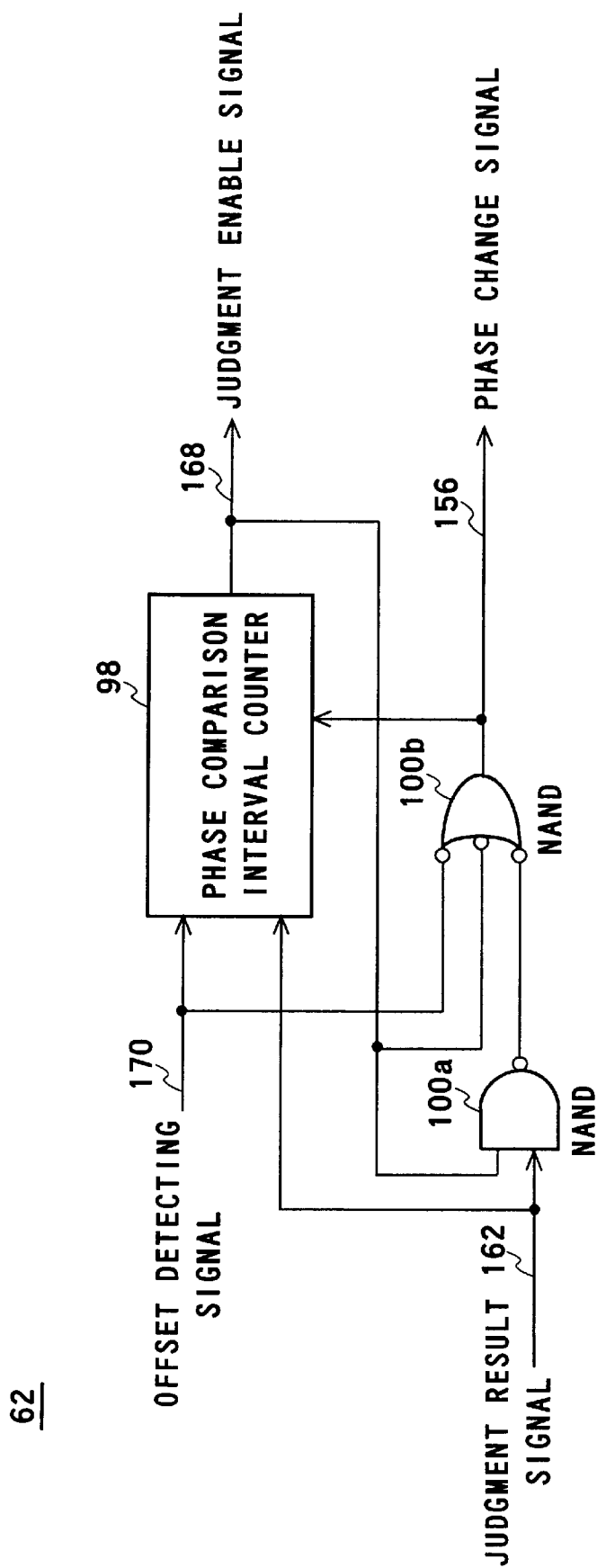
FIG. 13 is a block diagram showing an embodiment of the phase change control unit 62.

FIG. 13 is a block diagram showing an embodiment of the phase change control unit 62. The configurations shown in FIG. 13 bearing the same reference numerals as in FIG. 5 achieve the same or similar function and operation corresponding to those of FIG. 5. The phase change control unit 62 includes NAND circuits 100a and 100b, and a phase comparison interval counter unit 98.

The offset detecting signal 170 is input to the phase comparison interval counter unit 98 and the NAND circuit 100b. With the logical value "0" indicating that the offset detecting signal 170 is not detecting the phase of the delay clock generated by the minimum delay path, the phase change control unit 62 supplies to the shift clock generator 52 a phase change signal 156 requesting to change the phase of the shift clock 152.

When the offset detecting signal 170 is of the logical value "1", data of a desired delay time are loaded by the phase comparison interval counter unit 98. For example, when the phase of the shift clock is shifted by an amount corresponding to 10 ps and then a phase equivalent to 2 ps is shifted by one shifting, 5 is loaded into the counter and counted down each time the phase change signal 156 (1 pulse) is output. When the counted value becomes 0, the phase comparison interval counter unit 98 supplies to the result judging unit 58 a judgment enable signal 168 which indicates that the phase change signal 156 requesting the phase of the shift clock 152 to be shifted by the desired delay amount is output (logical value "1"). When the judging result signal 162 indicating (indicated by the logical value "1") that the phase of the delay clock 138 matches that of the shift clock 152 is input to the phase comparison interval counter unit 98, data of newly desired delay time are loaded to the counter by the phase comparison interval counter unit 98. then, the phase change control unit 62 outputs the phase change signal 156 to the shift supply unit 52.

Figure 14:
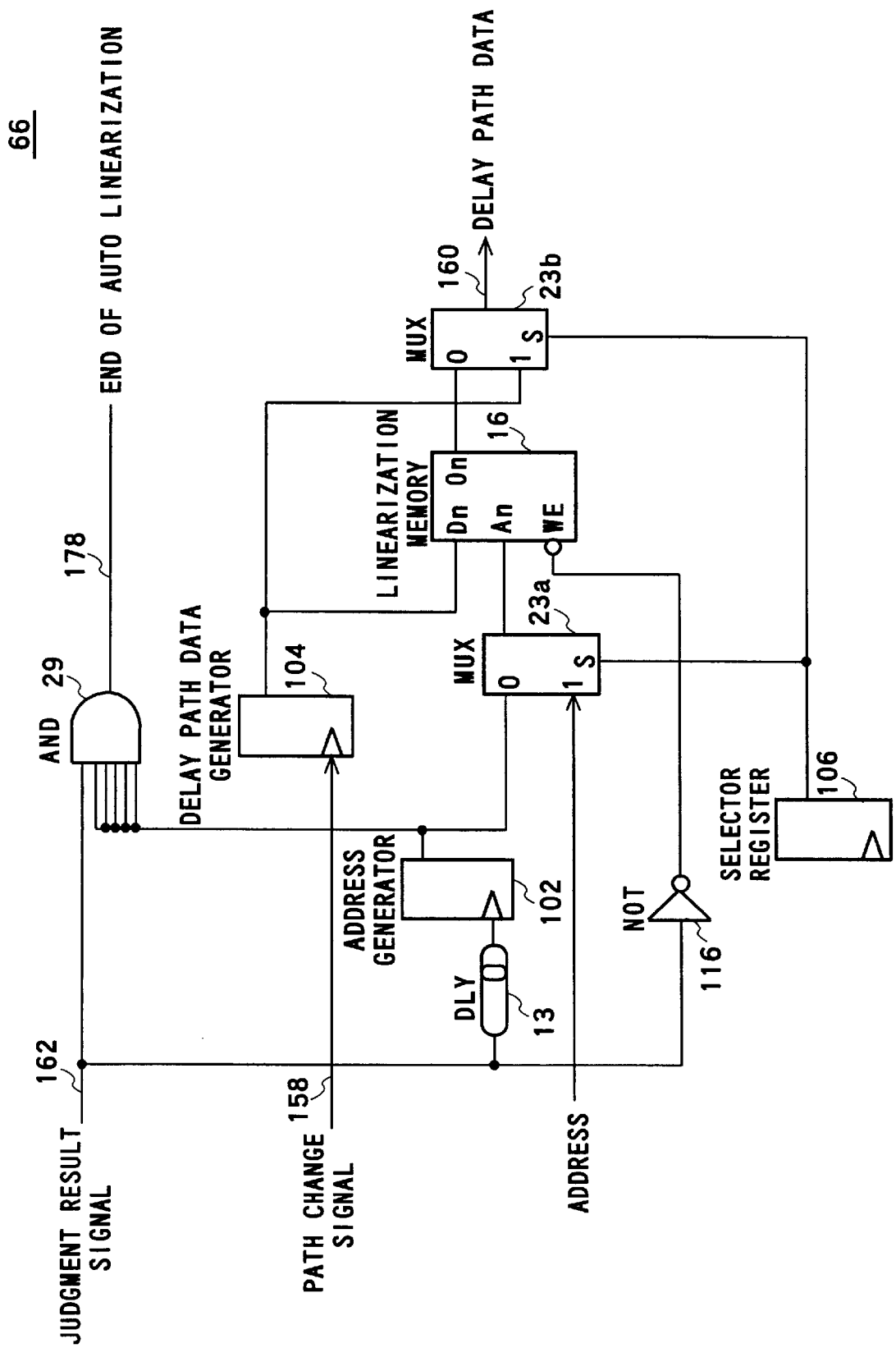
FIG. 14 is a block diagram showing an embodiment of the linearization memory control unit 66.

FIG. 14 is a block diagram showing an embodiment of the linearization memory control unit 66. The configurations shown in FIG. 14 bearing the same reference numerals as in FIG. 5 achieve the same or similar function and operation corresponding to those of FIG. 5. The linearization memory control unit 66 comprises: a delay element 13; a linearization memory 16; an AND circuit 29; selectors 23*a* and 23*b*; an address generator 102; a delay path data generator 104; a selector register; and an inverter 116.

The selector register 106 is provided in order to switch input terminals of the selector 23*a* and the selector 23*b*. During a test of the semiconductor device, an input "1" of the selector 23*a* and an input "0" of the selector 23*b* are selected, based on data of the selector register 106. During the test of the semiconductor device, the address which stores the delay path data having a desired delay amount is supplied to the linearization memory 16 via the selector 23*a*. The linearization memory 16 outputs to the variable delay circuit 10 the delay path data 160 stored in the address.

During judgment of the delay path, an input "0" of the selector 23*a* and an input "1" of the selector 23*b* are selected based on data of the selector register 106. A path change signal 158 is input to the delay path generator 104. When the path change signal 158 is supplied to the delay path generator 104, the delay path generator 104 generates data which specify the delay path so as to be supplied to a data input Dn of the linearization memory 16 and the input "1" of the selector 23*b*.

The address generator 102 outputs the address storing the delay path data to an address input An of the linearization memory 16 via the selector 23*a*, based on the judging result signal 162 (logical value "1") which indicates that the phases match. Since the judging result signal 162 is input to the judging result signal 162 via the delay element 13, the judging result signal 162 is delayed by a delay amount which the delay element 13 has. Thus, after the delay path data are stored in the linearization memory 16, the address generator 102 next outputs an address to store the delay path data.

When the judging result signal 162 indicates the match of the phases (logical value "1"), the linearization memory 16 stores the delay path data which are input to the data input Dn of the linearization memory 16, to an address specified by an address An of the linearization memory 16.

When the delay path data are stored in all address spaces of the linearization memory 16, the AND circuit 29 outputs to the sequence control unit 60 an automatic linearization terminating signal 178 which indicates that the judgment of the delay path is ended. In the present embodiment, the logical multiplication of the 5 bit address is taken. Thus, when 32 delay paths are stored in the linearization memory 16, the automatic linearization terminating signal 178 is output.

Figure 15:
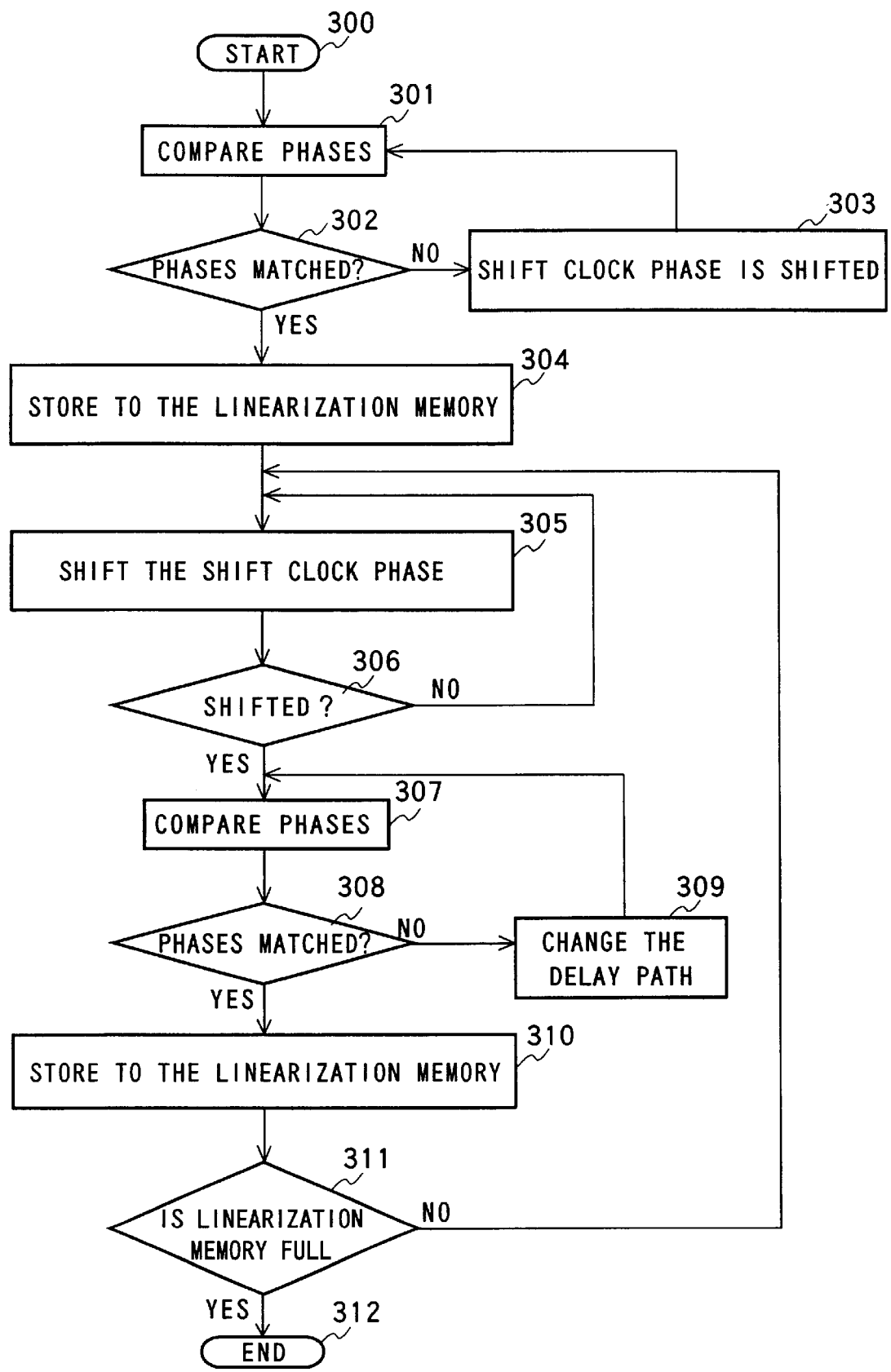
FIG. 15 is a flow chart describing a delay path detecting method by a delay time judging apparatus 48 according to the present embodiment.

FIG. 15 is a flow chart describing a delay path detecting method by a delay time judging apparatus 48 according to the present embodiment. The configurations shown in FIG. 14 bearing the same reference numerals as in FIG. 5 achieve the same or similar function and operation corresponding to those of FIG. 5. Hereinbelow, described is a method of detecting delay paths having predetermined delay amounts for each construction.

In step 300, the minimum delay path of the variable delay circuit 10 is selected. In step 301, the phase comparator 50 Compares a phase of the delay clock 138 and that of the shift clock 152, and outputs the comparison signal 154 (phase comparing step).

In step 302, whether or not the phase of the delay clock 138 matches that of the shift clock 152 is judged based on the comparison signal 154. Then, the judging result signal 162 is output to the phase change control unit 62, offset detecting unit 64 and the linearization memory control unit 66 (judging step).

When the phase of the delay clock 138 does not match that of the shift clock 152, the phase change control unit 62 outputs the phase change signal 156 to the shift clock supply unit 52 in step 303. The shift clock supply unit 52 shifts the phase of the shift clock 152 based on the phase change signal 156 (phase shift step). The shift clock 152 whose phase is shifted by a predetermined amount is compared to the phase of the delay clock 138 again in step 301. The phase comparison step (step 302) is repeated until the phase of the delay clock 138 matches that of the shit lock 152.

When the phase of the delay clock 138 matches that of the shift clock 152, the offset detecting unit 64 outputs an offset detecting signal 170 (logical value "1") to the result judging unit 58 and the phase change control unit 62. Then, in step 304, the linearization memory control unit 66 stores the delay path data on the minimum delay path, to the linearization memory 16 (offset detecting step). Thereafter, the linearization memory control unit 66 increments the address of the linearization memory 16. The phase change control unit outputs to the shift clock supply unit 52 the phase change signal 156 requesting to change the phase of the shift clock 152, based on the judging result signal 162 and offset detecting signal 170 indicating the match of the phases.

In step 305, the shift clock supply unit 52 outputs a shift clock 152 whose phase is shifted by a predetermined amount based on the phase change signal 156 (phase shift step). The 1 pulse of the phase change signal 156 indicates that the phase of the shift clock 152 is to be shifted by the predetermined amount; thus, when the phase of the shift clokc is to be shifted by five times the predetermined amount, the phase change control unit 62 outputs the phase change signal 156 of "5" pulse to the shift clock supply unit 52. Then, 5 is loaded to a down counter of the phase change control unit 62. The phase change control unit 62 decrements the counter value every time the phase change signal 156 is output therefrom. In step 306, whether or not the count value is 0 is judged. When the counter value becomes 0, the phase change control unit 62 outputs the judgment enable signal 168 to the result judging unit 58.

In step 307, the phase comparator 50 compares the phase of the delay clock 138 to that of the shift clock 152, so as to output the comparison signal 154 (phase comparing step). In step 308, the judging unit 54 judges whether o not the phase of the delay clock matches that of the shift clock 152 based on the comparison signal 154, so that the judging result signal 162 is output to the phase change control unit 62, offset detecting unit 64 and linearization memory control unit 66 (judging step).

In step 309, when the phase of the delay clock 138 does not match that of the shift clock 152, the judging unit 54 outputs the path change signal 158 to the linearization memory control unit 66. The linearization memory control unit 66 changes the delay path of the variable delay circuit 10 based on the path change signal 158 (delay path changing step). Step 307 will be repeated until the phase of the delay clock 138 obtained by changing the delay path matches the phase of the shift clock 152.

When the phase of the delay clock 138 matches that of the shift clock 152, the linearization memory control unit 66 stores data of the then delay path to the linearization memory 16, in step 310 (delay path specifying step). In step 311, the linearization memory control unit 66 detects whether or not the linearizatioin memory 16 is full. If the linearization memory 16 is not full in its capacity, the above steps 305 to 311 are repeated, so as to store the delay path data in the linearization memory 16.

When the linearization memory 16 becomes full in its capacity, the linearization memory control unit 66 outputs to the sequence control unit 60 the automatic linearization terminating signal 178 which indicates the end of the automatic linearization, in step 312. When the automatic linearization terminating signal 178 is output, the delay time judging apparatus 48 terminates an automatic linearization process.

FIGS. 16A, 16B, 16C and 16D show relationship between the phase of the delay clock 138 and that of the shift clock 152 shown in the flow chart of FIG. 15. In these figures, the rising edges thereof are only shown. FIG. 16A describes a phase shifting method in the steps 300 to 304 shown in FIG. 15. The phase of the delay clock 138 which is delayed by the minimum delay path of the variable delay path 10 is compared to the phase of the shift clock 152, so that the phase of the shift clock 152 is shifted until both the phases match. Then, when the phase of the delay clock 138 match that of the shift clock 152, the offset detecting unit 64 outputs the offset detecting signal 170 (logical value "1") which indicates that the delay amount of the minimum delay path is determined.

FIG. 16B describes a phase shifting method in the steps 305 and 306 shown in FIG. 15. The phase of the shift clock 152 is shifted based don a desired delay time. For example, when a delay path having a delay amount of 10 ps is determined, the phase of the shift clock 152 is shifted by the amount equivalent to 10 ps.

FIG. 16C and FIG. 16D describes a phase shifting method in the steps 307 to 311 shown in FIG. 15. The delay path is changed until the phase of the delay clock 138 matches that of the shift clock 152.

When the phase of the delay clock 138 matches that of the shift clock 152, the linearization memory control unit 66 stores data of the then delay path in the linearization memory 16, and increments the address of the linearization memory 16. The delay time judging apparatus 48 repeats the above processes of FIG. 16C and FIG. 16D until there is no longer a memory space available for the linearization memory 16. Therefore, by implementing the delay time judging apparatus according to the present embodiments, the shifted amount of the shift clock 152 is gradually increased by a predetermined, so that the combination of the delay elements (for example, 12a to 12n) of the variable delay circuit 10 corresponding to respective shifted amounts can be respectively stored in the linearization memory 16.

As evident from the above description, the present invention judges the delay path having a desired delay amount and can store the delay path data which specify the delay paths having the desired delay amounts in the linearization memory.

Although the present invention has been described by way of exemplary embodiments, it should be understood that many changes and substitutions may be made by those skilled in the art without departing from the spirit and the scope of the present invention which is defined only by the appended claims.

What is claimed is:

1. A delay time judging apparatus judging a timing of an output signal output from a delay circuit being designed to delay an input clock signal by a predetermined timing, comprising:

a shift clock supply unit outputting a shift clock generated upon shifting a phase of the input clock signal of the delay circuit;

a phase comparing unit outputting a comparison signal based on a comparison between a phase of the shift clock and a phase of the input clock signal of the delay circuit; and a judging unit judging whether or not the timing of the output signal of the delay circuit is equal to the predetermined timing based on the comparison signal.

2. A delay time judging apparatus of claim 1, wherein the comparison signal is output in a manner that an edge timing of the delay clock is compared to that of the shift clock.

3. A delay time judging apparatus of claim 2, wherein said phase comparing unit outputs the comparison signal in the form of a pulse.

4. A delay time judging apparatus of claim 3, wherein said judging unit includes:

a comparison signal counting unit which outputs a counted value obtained by counting the pulse at a predetermined time interval; and a result judging unit which determines whether or not a phase of the delay clock matches that of the shift clock based on the counted value.

5. A delay time judging apparatus of claim 4, wherein said result judging unit includes a first judgment unit which judges that the phase of the delay clock matches that of the shift clock on the condition that the counted value lies within a predetermined range.

6. A delay time judging apparatus of claim 4, wherein said result judging unit further includes:

a second judgment unit in which a counted value is zero at a predetermined time interval and which judges that the phase of the delay clock matches that of the shift clock in the event that at a later time of the predetermined time intervals the counted value becomes equal to a pulse number of the shift clock at the predetermined time interval.

7. A delay time judging apparatus of claim 4, wherein said result judging unit further includes:

a third judgment unit which judges that the phase of the delay clock matches that of the shift clock in the event that the counted value equals to the number of pulse of the shift clock at the predetermined time interval and at a later time the counted value becomes 0 at the predetermined time interval.

8. A delay time judging apparatus of claim 4, further comprising a sequence control unit which instructs said comparison signal counting unit to count the comparison signal at a predetermined time duration.

9. A delay time judging apparatus of claim 1, wherein said phase comparing unit includes a flip flop having a data input to which the delay clock is input and a clock input to which the shift clock is input.

10. A delay time judging apparatus of claim 1, wherein the delay circuit includes at least one delay path that delays the input signal, and wherein the delay circuit changes the at least one delay paths in the event that the shift clock does not match the delay clock.

11. A delay time judging apparatus of claim 10, wherein either the phase of the shift clock or the at least one delay path is changed in the event that the phase of the shift clock does not match that of the delay clock.

12. A delay time judging apparatus of claim 10, further comprising a linearization memory which stores data specifying the at least one delay paths.

13. A delay time judging apparatus of claim 12, further comprising a linearization memory control unit which instructs said linearization memory to store a desired delay time and the data specifying the at least one delay path in the event that the phase of the shift clock matches that of the delay clock.

14. A delay time judging apparatus of claim 10, further comprising a phase change control unit which changes the phase of the shift clock so as to match the phase of the delay clock in the event that the at least one delay path is set in a predetermined standard manner and the phase of the shift clock does not match that of the delay clock.

15. A delay time judging apparatus of claim 1, wherein a period of the shift clock generated by said shift clock supply unit is an integral multiple of the reference clock.

16. A delay time judging apparatus of claim 15, wherein the period of the shift clock is greater than a delay circuit.

17. A delay time judging method of judging whether or not delay time of a delay circuit for delaying an input signal is equal to a desired delay time, the method comprising:

generating a shift clock having a phase that is delayed by a predetermined amount relative to a phase of the input clock signal; comparing a phase of a delay clock which is obtained by delaying the input clock signal by the delay circuit, to that of the shift clock;

judging whether or not the phase of the shift clock matches that of the delay clock; and repeating said generating the shift clock, said comparing the phase and said judging until the phase of the delay clock matches that of the shift clock.

18. A delay time judging method of claim 17, in a case where the delay circuit includes a plurality of delay paths which delay the input signal by different delay time, further comprising:

changing the delay paths; and repeating said comparing the phase, said judging and said changing the delay paths until the phase of the delay clock matches that of the shift clock.

19. Semiconductor device testing apparatus for testing a semiconductor device, comprising:

a variable delay circuit having a plurality of delay paths;

a shift clock supply unit which supplies a shift clock having a desired delayed time and phase relative to a reference clock;

a phase comparing unit which compares a phase of the shift clock to a phase of a delay clock for which the reference clock is delayed by the delay circuit, so as to output a comparison signal;

a judging unit which judges whether or not the delay time of the variable delay circuit is equal to the desired delay time;

a timing generator including a linearization memory which stores a delay path necessary to generate the desired delay time based on the comparison signal;

a pattern generator which generates a test pattern to be input to the semiconductor device;

a waveform shaper which outputs a waveform-shaped test pattern which shaped the test pattern so as to be suitable for the semiconductor device under test, based on the delay clock in which the reference clock is delayed by the delay paths stored in the linearization memory, and the test pattern;

a contact portion which places the semiconductor device under test thereon and inputs the waveform-shaped test pattern to the semiconductor device under test; and a comparator which compares an output signal output from the semiconductor device which has input the waveform-shaped test pattern, to an expectation value which is expected to output from the semiconductor device under test and that is output from said generator.

* * * * *